United States Patent
Ngo et al.

(10) Patent No.: US 7,719,315 B2
(45) Date of Patent: May 18, 2010

(54) PROGRAMMABLE LOCAL CLOCK BUFFER

(75) Inventors: Hung C. Ngo, Austin, TX (US); Jente B. Kuang, Austin, TX (US); James D. Warnock, Somers, NY (US); Dieter F. Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 739 days.

(21) Appl. No.: 11/554,666

(22) Filed: Oct. 31, 2006

(65) Prior Publication Data

US 2008/0101522 A1     May 1, 2008

(51) Int. Cl.
*H03K 19/00* (2006.01)

(52) U.S. Cl. .............................. 326/93; 326/98; 326/95; 327/112; 327/202; 327/172; 327/291; 365/233.11

(58) Field of Classification Search .................. 326/93, 326/98, 95; 327/112, 202, 172, 291; 365/233.11
See application file for complete search history.

(56) References Cited

U.S. PATENT DOCUMENTS

| | | | |
|---|---|---|---|
| 5,130,568 A * | 7/1992 | Miller et al. | 327/202 |
| 5,929,684 A * | 7/1999 | Daniel | 327/299 |
| 6,107,850 A * | 8/2000 | Shimizu | 327/172 |
| 6,268,746 B1 * | 7/2001 | Potter et al. | 326/93 |
| 6,567,337 B1 * | 5/2003 | Sprague et al. | 365/233.11 |
| 6,822,500 B1 | 11/2004 | Warnock et al. | 327/295 |
| 6,825,695 B1 * | 11/2004 | Dhong et al. | 326/95 |
| 6,927,615 B2 * | 8/2005 | Dhong et al. | 327/291 |
| 7,372,305 B1 * | 5/2008 | Ngo et al. | 326/98 |
| 7,459,950 B2 * | 12/2008 | Ngo et al. | 327/172 |
| 2005/0189967 A1 * | 9/2005 | Rosen | 327/112 |

* cited by examiner

*Primary Examiner*—Sudhanshu C Pathak
(74) *Attorney, Agent, or Firm*—Garg Law Firm, PLLC; Rakesh Garg; Jeffrey S LaBaw

(57) ABSTRACT

A programmable clock generator circuit receives control signals and a global clock and generates a pulsed data clock and a scan clock in response to gating signals. The clock generator has data clock and scan clock feed-forward paths and a single feedback path. Delay control signals program delay elements in the feedback path and logic gates reshape and generate a feedback clock signal. The global clock and the feedback clock signal are combined to generates a pulsed local clock signal. A scan clock feed-forward circuit receives the local clock and generates the scan clock. A data clock feed-forward circuit receives the local clock and generates the data clock with a logic controlled delay relative to the local clock signal. The feedback clock is generated with controlled delay thereby modifying the pulse width of the data and scan clocks independent of the controlled delay of the data clock feed-forward path.

21 Claims, 7 Drawing Sheets

PROGRAMMABLE LOCAL CLOCK BUFFER

TECHNICAL FIELD

The present invention relates to clock buffer circuits and in particular to clock buffers that allow for programmable modification of the clock pulse width and output delay.

BACKGROUND INFORMATION

Master-slave latches are employed commonly in integrated circuit design. In a master-slave latch, a master latch latches data in response to a first clock signal, and a slave latch coupled to the master latch latches data (latched by the master latch) in response to a second clock signal. Typically the first and second clock signals are approximately complimentary (e.g., 180 degrees out of phase).

While a pulsed mode of operation reduces power consumption, such a mode of operation is susceptible to a number of problems. If the pulse employed to latch data into the slave latch is too wide, the master-slave latch may be susceptible to early mode problems such as race through (e.g., as both master and slave latches are active simultaneously for the duration of the slave latching pulse). Likewise, if the pulse employed to latch data into the slave latch is too narrow, data may not be reliably latched by the slave latch. Accordingly, designing and implementing a pulsed mode of operation for a master-slave latch is difficult, and often requires multiple design and test iterations.

Many complex digital logic circuits, including processors, employ a technique called "pipelining" to perform more operations per unit of time (i.e., to increase throughput). Pipelining involves dividing a process into sequential steps, and performing the steps sequentially in independent stages. For example, if a process can be performed via n sequential steps, a pipeline to perform the process may include n separate stages, each performing a different step of the process. Since all N stages can operate concurrently, the pipelined process can potentially operate at N times the rate of the non-pipelined process.

Hardware pipelining involves partitioning a sequential process into stages, and adding storage elements (i.e., groups of latches or flip-flops, commonly called registers) between stages to hold intermediate results. In a typical hardware pipeline, combinational logic within each stage performs logic functions upon input signals received from a previous stage, and the storage elements positioned between the combinational logic of each stage are responsive to one or more synchronizing clock signals. The one or more clock signals control the movement of data within the pipeline.

Within an integrated circuit, a single global clock signal often provides a timing reference for the movement of data. Various circuits have been used to distribute a global clock signal across a surface of an integrated circuit and local clock buffers located at different points on the surface are used to generate local clock signals derived from the global clock signal.

A global clock distribution system is used to distribute a global clock signal across a surface of the integrated circuit. In one prior art example, a first local clock buffer and a second local clock buffer are located at different points on the surface of the IC and receive the global clock signal and generates exemplary first and second local clock signals, "CLK_A" and "CLK_B" respectively.

In general, the local clock signals CLK_A and CLK_B may be used to synchronize the operations of various logic structures (e.g., gates, latches, registers, and the like) of logic circuitry of the integrated circuit. The local clock signals CLK_A and CLK_B may be two different "phases" of a two-phase clocking scheme. As is common, the two-phase clocking scheme may be used to control the operations of master-slave latch pairs positioned between the combinational logic of pipeline stages. Such master-slave latch pairs form flip-flops. One of the local clock signals CLK_A and CLK_B may be provided to control inputs of the master latches of the flip-flops, and the other one of the local clock signals CLK_A and CLK_B may be provided to control inputs of the slave latches of the flip-flops. The local clock buffers may also use the global clock signal to generate a local clock signal to generate additional versions of CLK_A and CLK_B. The internal structures of the local clock buffers may differ leading to timing delays between the local clocks. Generating additional versions of the local clocks may lead to skews which adds to the timing problems.

As the local clock signals CLK_A and CLK_B are used to synchronize the operations of logic structures, the skews of the local clock signals CLK_A and CLK_B may result in timing problems that cause the logic circuitry of the integrated circuit to produce incorrect values. For example the local clock signal CLK_A may be provided to control inputs of master latches of flip-flops separating the combinational logic of pipeline stages, and the local clock signal CLK_B may be provided to control inputs of slave latches of the flip-flops. The skews of the local clock signals CLK_A and CLK_B may reduce an amount of time a signal derived from an output of a first flip-flop positioned at a beginning of a pipeline stage has to propagate through the combinational logic of the stage and reach a second flip-flop positioned at an end of the pipeline stage. If a cycle time (i.e., period) of the global clock signal is not made long enough, the signal may not reach the second flip-flop before the master latch "captures" the value of the signal at the input, and the flip-flop may capture an incorrect value of the signal. As a result, the logic circuitry of the integrated circuit may produce one or more incorrect values.

Therefore, there is a need for programmable circuitry to reduce or compensate for the skew in local clocks as well as generating a programmable pulse clock whose pulse width may be used to optimize local clock timing.

SUMMARY OF THE INVENTION

A programmable clock generator has a clock gating circuit that receives a global clock and generates a local clock in response to a gated feedback signal. When the feedback signal is enabled, the pulse width of the positive cycle of the local clock is determined by the delay through the feed-forward circuitry producing an output clock and feedback circuitry generating the feedback signal from the output clock.

In one embodiment, the feed-forward circuitry is composed only of buffer circuitry that isolates the local clock node from the output node. The feedback circuitry has one or more delay elements that delay at least the positive edge of the output clock in response to one or more control signals. If the control signals have a first logic state the feed-back circuitry has its normal propagation delay and when the control signals have a second logic state the feed-back circuitry has additional delay which operates to increase the pulse width of the output clock. The local clock is set to a logic one when the global clock transitions to a logic zero. The logic one transition of the local clock propagates through the feed-forward circuitry with a first delay and through the feedback circuitry with a second delay before it arrives back at the input circuitry as a feedback signal. The combination the static logic state of the global clock and the feedback signal sets the local clock back to a logic zero thus making its positive pulse width equal to the sum of the first and second delays. The negative transition of the logical clock propagates through the feed-forward circuitry but is degated by the logic of the feedback circuitry.

In a second embodiment, the feed-forward circuitry has an additional clock delay element that delays only the positive transition of the local clock in response to a clock delay signal. When the clock delay signal is a logic zero, the clock delay element is degated and normal operation as described above is enabled. When the clock delay signal is a logic one, the clock delay element is turned ON and delayed clock operation is enabled. In this mode, additional delay is added to the feed-forward path resulting in the output clock being a delayed relative to the global clock and the local clock. The pulse width is only a function of the normal delay in the feed-forward path and the feedback path.

In another embodiment, the feed-forward path for the output clock is degated and the local clock is directed through a scan clock circuit that generates a scan clock with the controlled pulse width while the output clock is forced to a static logic state.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings in which.

DETAILED DESCRIPTION

Figure 1A:
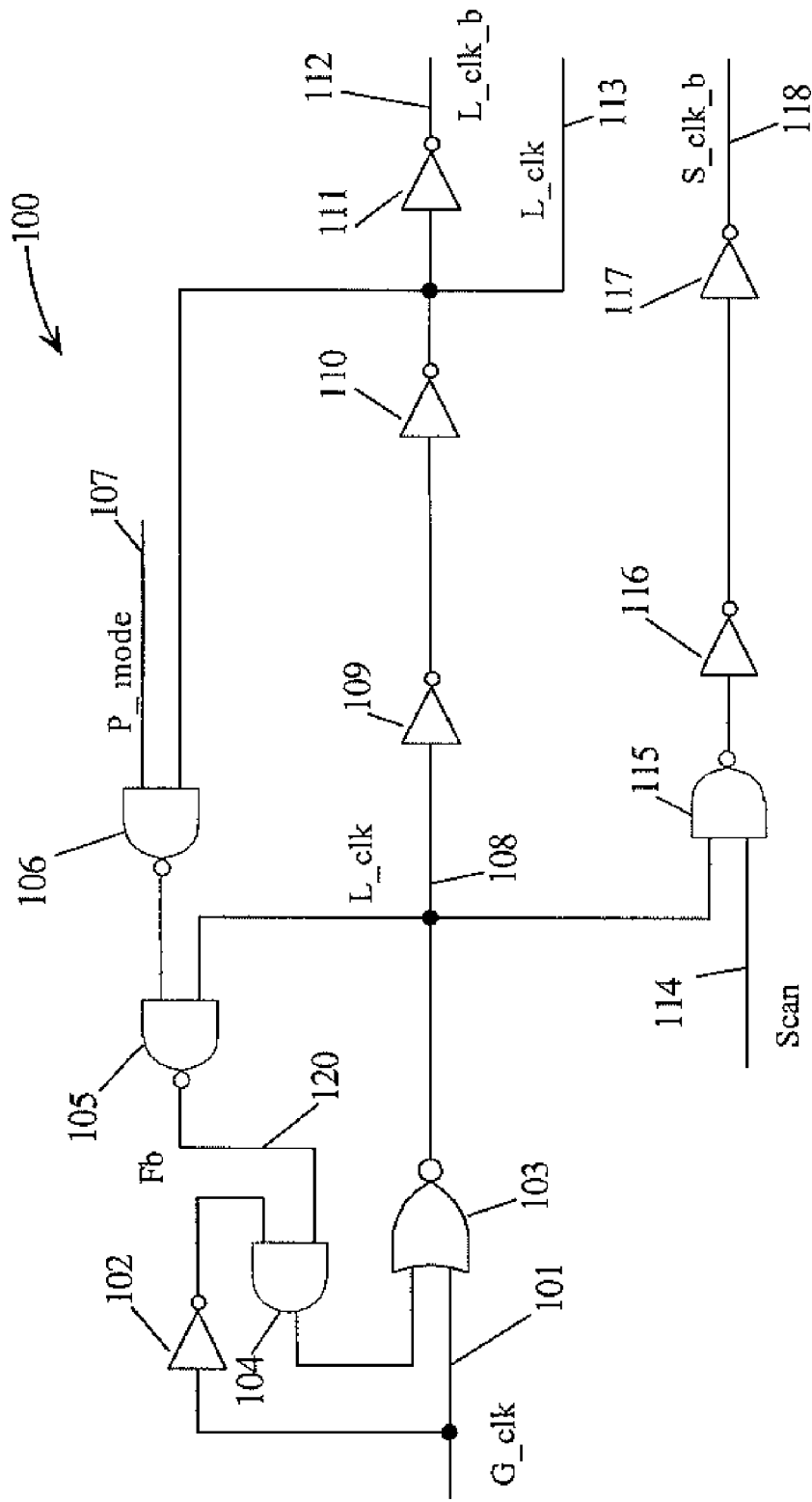
FIG. 1A is a prior art circuit for generating a pulsed clock from a global clock using a gated feedback path.

In the following description, numerous specific details are set forth to provide a thorough understanding of the present invention. For example, specific logic functions and the circuitry for generating them may be described; however, it would be recognized by those of ordinary skill in the art that the present invention may be practiced without such specific details. In other instances, well-known circuits have been shown in block diagram form in order not to obscure the present invention in unnecessary detail. Refer now to the drawings wherein depicted elements are not necessarily shown to scale and wherein like or similar elements are designated by the same reference numeral by the several views.

FIG. 1A is prior art circuitry 100 for generating a pulsed or normal data clock and scan clock. A Global clock, G_clk 101, is received in an exemplary NOR logic gate 103 that has a second input coupled to AND logic gate 104. AND gate 104 has a first input coupled to a feedback signal Fb 120 and a second input coupled to the output of inverter 102 which generates a complement of G_clk 101. If G_clk 101 is a logic one the output of NOR gate 103, L_clk 108, is forced to a logic zero. The logic zero state of L_clk 108, immediately degates NAND 105 forcing Fb 120 to a logic one, however the output of inverter 102 is a logic zero forcing the output of AND 104 to a logic zero. Since NAND 105 is immediately degated when L_clk 108 is a logic zero, logic zero state of L_clk 108 is not affected by any delay in the feed-forward path (inverters 109-110) or the feedback path (NAND 106). In the normal mode (non-pulse mode), P_mode 107 is a logic zero and the output of NAND 106 is forced to a logic one enabling NAND gate 105. In this mode, Fb 120 follows in phase with G_clk 101. The other input to AND 104 follows out of phase with G_clk 101. Except for logic delays, the second input to NOR 103 is always at a logic zero and thus NOR 103 operates as an inverter when P_mode 107 is a logic zero.

In the normal mode, L_clk 113, L_clk_b 112, and S_clk_b 118 follow the transitions of G_clk 101 delayed only by the circuit delays in their corresponding feed-forward logic paths comprising inverters 109-110, inverters 109-111, and NAND 115 plus inverters 116-117, respectively. In the pulse mode, P_mode 107 is a logic one and NAND 106 operates as an inverter and couples L_clk 113 into the feedback path comprising NAND 105 and AND 120.

When G_clk 101 transitions to a logic zero, both inputs of NOR 103 are at a logic zero and L_clk 108 transitions to a logic one starting pulse operation. A delay time later L_clk 113 also transitions to a logic one forcing the output of NAND 106 to a logic zero de-gating NAND 105 and causing Fb 120 to transition to a logic one. Since both inputs of AND 104 are now a logic one, its output transitions to a logic one forcing L_clk 108 back to a logic zero setting the pulse width of L_clk 108. The transition of L_clk 108 to a logic zero again de-gates NAND 105 and the pulse of L_clk 108 propagates to L_clk 113 and L_clk_b 112. The cycle repeats when G_clk 101 again transitions from a logic one to a logic zero.

Figure 1B:
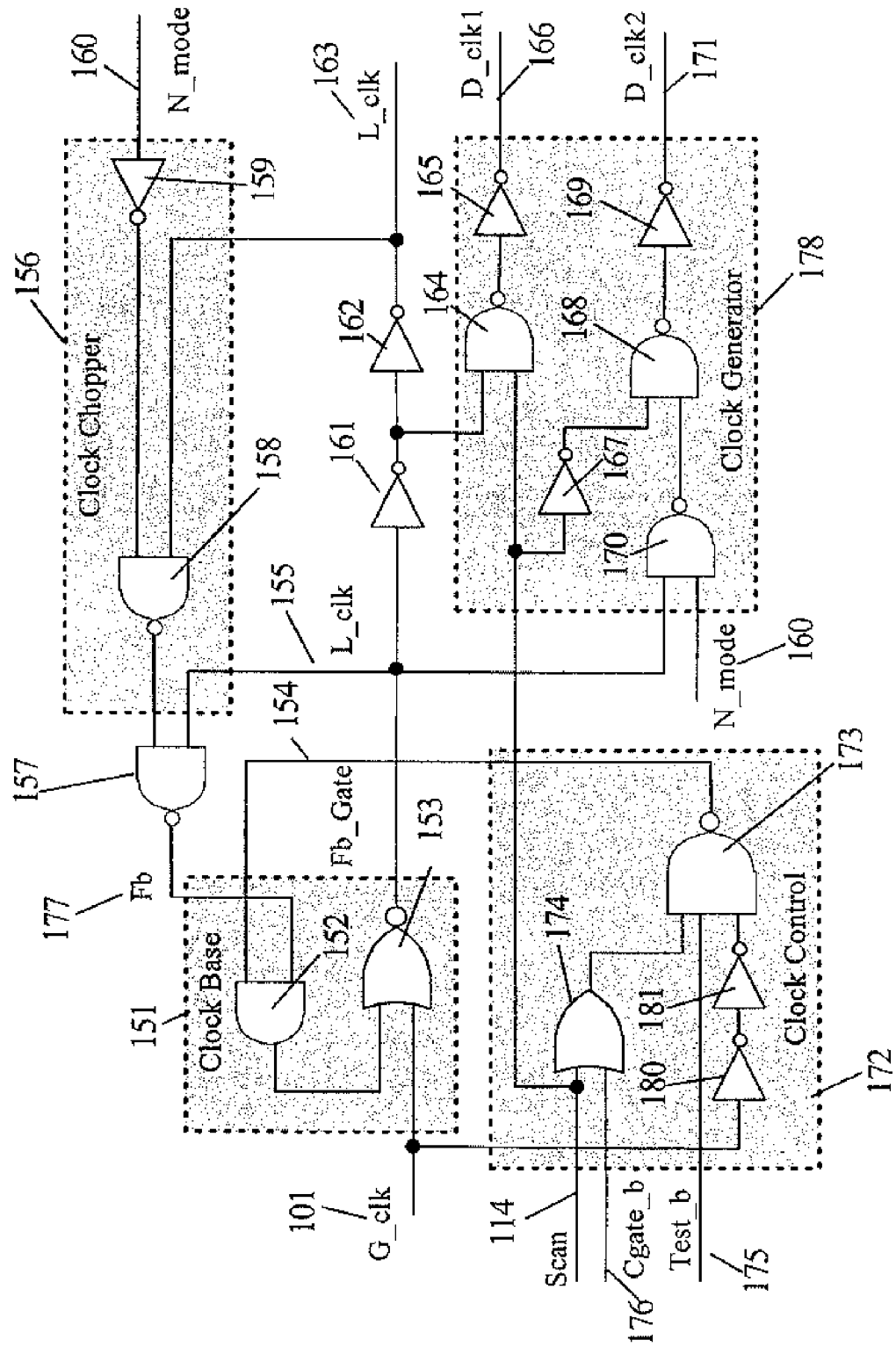
FIG. 1B is a circuit block diagram of a prior art circuit for generating a normal or pulsed data clock and a scan clock.

FIG. 1B is another prior art circuit 150 for generating a local clock L_clk 163 and clocks D_clk1 166 and D_clk2 171. This circuitry has a clock control circuit that receives exemplary control signals Scan 114, Cgate_b 176, and Test_b 175 along with G_clk 101 and generates a feedback gating signal Fb_Gate 154. G_clk 101 is delayed by inverters 180 and 181 to prevent a race condition. G_clk 101, Fb 177 and Fb_Gate 154 are combined in the clock base circuitry 151 to generate local clock L_clk 155. The gate signal Fb_Gate 154 determines if the clock base circuitry receiving Fb 177 is enabled. When Scan 114 or Cgate_176 are a logic one and Test_b 175 is a logic one, then NAND 173 is enabled and Fb_Gate 154 generates the complement of G_clk 101 the same as inverter 102 relative to FIG. 1A.

Local clock L_clk 155, is buffered by two inverters 161 and 162 and generates L_clk 163. When N_mode 160 is a logic one, the feedback path comprising NAND gates 157-157 does not operated to produce a pulse clock. Rather L_clk 163 is the complement of G_clk 101. When Scan 114 is a logic one, inverter 167 degates NAND 168 forcing D_clk2 to a logic zero. However, NAND 164 is enabled and D_clk1 166 is the complement of L_clk 155.

When N_mode 160 is a logic zero, the feedback path is enabled and a pulse width equal to the delay through the feed-forward path and the feedback path is generated at L_clk 163. The pulse clock also is generated at D_clk1 166 if Scan 114 is a logic one. The pulse width at L_clk 163 is not programmable and is determined by the delays designed into the components in the feed-forward and the feedback paths.

Figure 2:
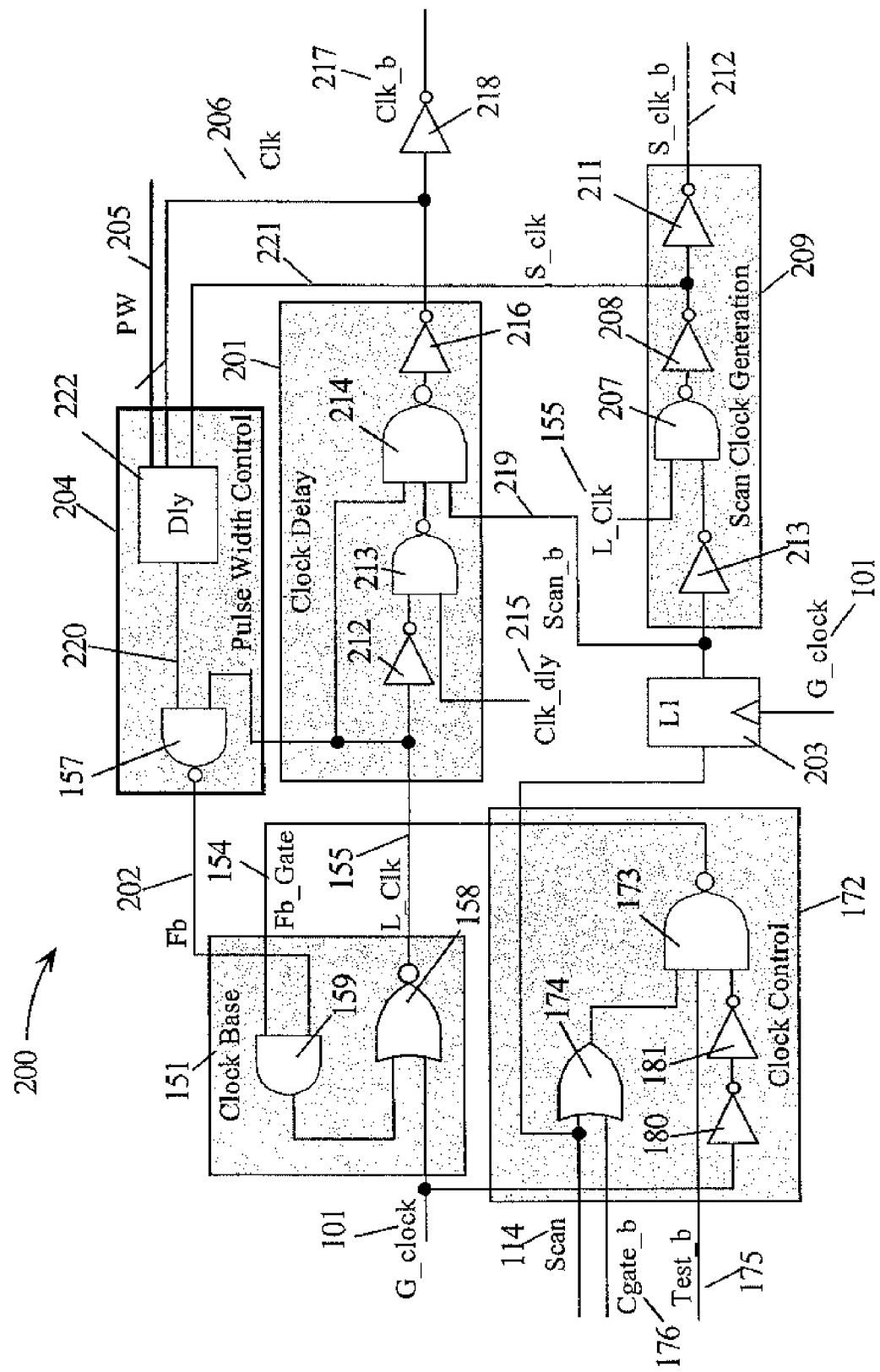
FIG. 2 is a circuit block diagram of circuitry for generating a pulsed data clock and a scan clock according to embodiments of the present invention

FIG. 2 is a schematic of a pulse clock circuit 200 according to an embodiment of the present invention. In this embodiment, the clock base 151 and the clock control circuitry 172 are the same as described relative to FIG. 1B. However, the feedback path in pulse clock circuit 200 includes a pulse width control element 204 that enables programming the pulse width at output Clk 206 and Clk_b 217 in response to control signals PW 205 and clock signals S-clk 221 and Clk 206. Pulse clock circuit 200 also has a clock delay circuit 201 in the feed-forward path whose function is enabled and disabled by Clk_dly 215.

Pulse clock circuit 200 latches the state of Scan 114 into latch L1 203 in response to G_clk 101. If the scan mode is disabled, then Scan_b 219 is a logic one and the Scan clock generator 209 is disabled by inverter 213 which forces S_clk_b to a logic one by action of NAND 207 and inverters 208 and 211. The logic one of Scan_b 219 enables one input of NAND 214 which in turn enables the generation of a pulse clock at Clk 206 and Clk_b 217. If Clk_dly 215 is a logic one, then the positive transition of L_clk 155 has an additional delay as it propagates through Clock delay 201.

Pulse clock circuit 200 has two distinct modes of operation; mode (1) where pulse clock Clk 206 is generated with a programmed pulse width PW(p) in response to control signals PW 205 and the delay of the pulse relative to L_clk 155 is determined by the nominal delay through NAND 214 and inverter 216. In mode (2), pulse clock Clk 206 is generated with a programmed pulse width PW(p) and the delay of the pulse relative to L_clk 155 is determined by the additional delay of inverter 212 and NAND 213. The pulse width of L_clk 155 is determined by the delay of the feed-forward path (Clock delay 201, inverter 216) and the feedback path (Pulse width control 204, NAND 157, AND 159 and NOR 158). The circuitry of the present invention changes the delay from L_clk 155 to Clk 206 while keeping the pulse width the same in both mode (1) and mode (2).

In mode (1), Clk_dly 215 is a logic zero and the output of NAND 213 is set to a logic one, enabling 214 to operate as an inverter when Scan_b 219 is also a logic one (non-scan mode). When G_clk 101 is a logic one, the output of NOR 158 is a logic zero. NAND 173 is gated ON (Scan 114 or Cgate_b 176 and Test_b 176 are all a logic one) and AND 159 is turned OFF; its output is a logic zero. G_clk 101 is delayed by inverters 180 and 181 to prevent a race condition. When G_clk 101 transitions to logic zero, NAND 173 is gated OFF enabling AND 159. Likewise, both inputs to NOR 158 are a logic zero thus L_clk 155 transitions to a logic one starting the process of generating a pulse clock signal.

The positive transition on L_clk 155 propagates as a positive transition to Clk 206 via NAND 214 and inverter 216 with a delay defined as Dly A. Pulse width control 204 has a delay defined as Dly P and determined predominately by the control signals PW 205. Additionally, the feedback circuitry has the delay of NAND 157, AND 159 and finally NOR 158 such that the total feedback delay is defined as Dly B. The logic one transition of L_clk 155 enables NAND 157. The pulse width of L_clk 155 is determined by the total time (Dly A+Dly B in mode (1)) required for the logic one transition to propagate through the feed-forward path and the feedback path back to the input of NOR 158 whereby L_clk 155 is forced back to a logic zero. When Clk_dly 215 is a logic zero, this clock pulse propagates to Clk 206 with a pulse width determined by the sum of Dly A and Dly B.

In mode (2), Clk_dly 215 is a logic one and NAND 213 operates as an inverter. When L_clk 155 transitions to a logic one, it takes and additional delay time (defined as Dly C) for the positive edge to propagate through inverter 212 and NAND 213 before all the inputs of NAND 214 are at a logic one. Thus, the positive transition of Clk 206 is delayed a time relative to the positive transition of L_clk 155 defined by the sum of Dly A and Dly C wherein Dly C is added in response to a logic one state of Clk_dly 215.

As described before, when G_clk 101 is a logic one, the output of NOR 158 is a logic zero. NAND 173 is gated ON (Scan 114 or Cgate_b 176 and Test_b 176 are all a logic one) and AND 159 is turned OFF and its output is a logic zero. When G_clk 101 transitions to logic zero, NAND 173 is gated OFF enabling AND 159 for Fb 202. Likewise, both inputs to NOR 158 are a logic zero and L_clk 155 transitions to a logic one starting the process of generating a pulse clock signal.

The positive transition on L_clk 155 propagates as a positive transition to Clk 206 via NAND 214 and inverter 216 this time with a delay defined as Dly A+Dly C. As defined relative to mode (1), the total feedback delay is defined as Dly B. The logic one transition of L_clk 155 enables NAND 157. In mode (2), the pulse width of L_clk 155 is now determined by the total time (Dly A+Dly B+Dly C) required for the logic one transition to propagate the feed-forward path and the feedback path back to the input of NOR 158 whereby L_clk 155 is forced back to a logic zero. The pulse width of L_clk 155 is again determined by the total time defined by the sum of Dly A, Dly B, and Dly C. However, in mode (2) the pulse width of L_clk 155 must propagate through inverter 212, NAND 213 and NAND 214 before it is asserted as Clk 206. The positive edge of the pulse at L_clk 155 is delayed by a time equal to Dly C, however the negative edge is only delayed by a time Dly A. Thus, the pulse width asserted at Clk 206 is equal to the time defined by the sum of Dly A and Dly B which is the same as mode (1). Embodiments of the present invention enables the generation of a pulse clock that has independent control of pulse width and delay relative to a local clock edge in a loop comprising coupled feed-forward and feedback paths.

If Scan 114 is a logic one, then Scan_b 219 is a logic zero and NAND 214 is degated and its output is a logic one which forces a static state of a logic zero at Clk 206 and a logic one at Clk_b 217. NAND 207 is enabled and S_clk 221 is the active input to pulse width control 204 that ultimately generates a pulse at L_clk 155 as described in mode (1) relative to FIG. 2. In this case, S_clk 221 and S_clk 212 are pulsed scan clocks.

Figure 3:
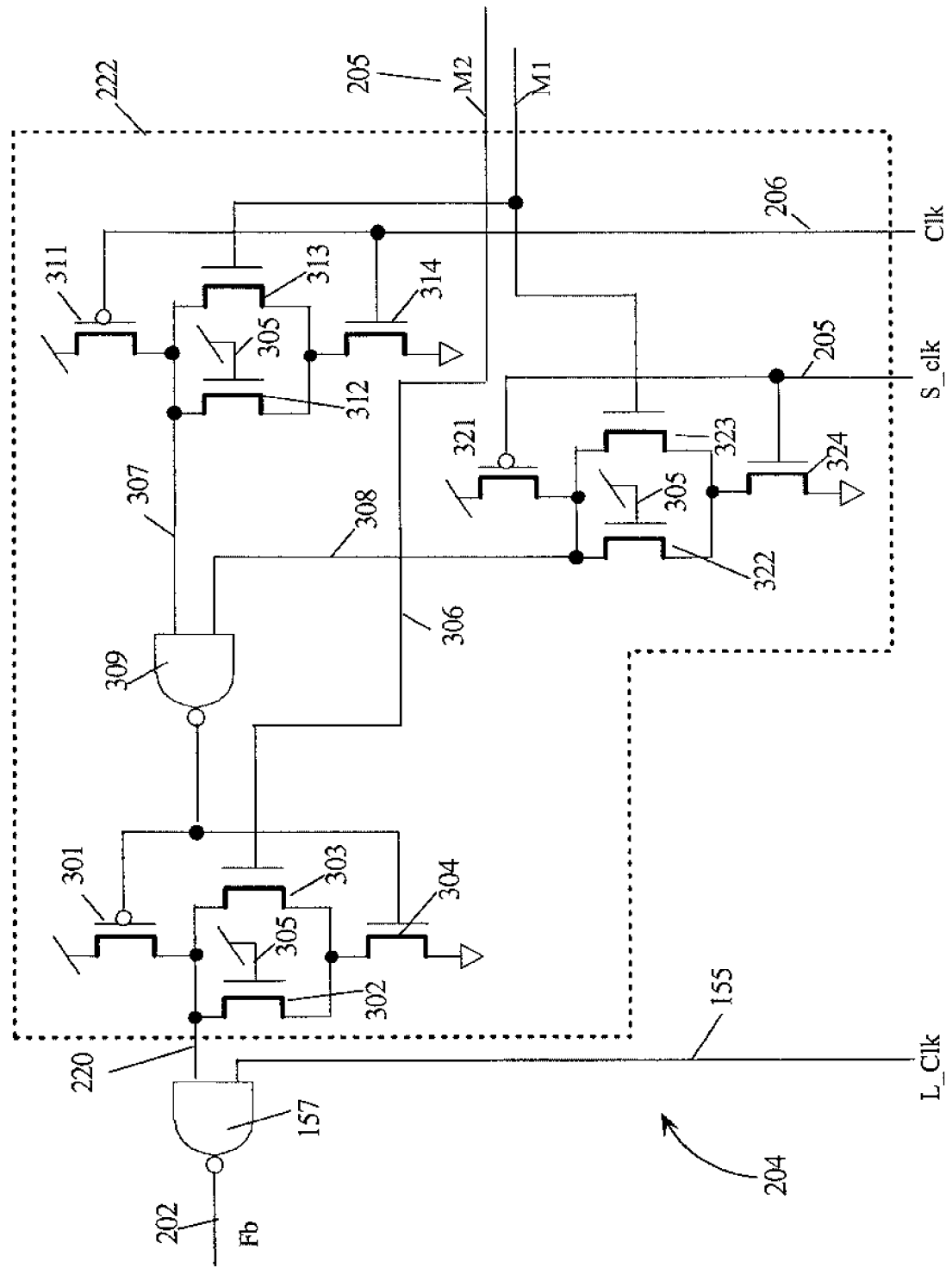
FIG. 3 is a circuit diagram of the feedback circuitry according to embodiments of the present invention.

FIG. 3 is a detailed circuit diagram of pulse width control 204 according to another embodiment of the present invention. NAND 157 receives the output of delay circuit 222 and is gated by L_clk 155 generating feedback clock signal Fb 202. When Scan 114 is a logic one, Clk 206 is a logic zero which turns ON PFET 311 pulling node 307 to a logic one enabling NAND gate 309 to operate as an inverter relative to node 308. Likewise, When Scan 114 is a logic one, S_clk 205 is a logic zero which turns ON PFET 321 pulling node 308 to a logic one enabling NAND gate 309 to operate as an inverter relative to node 307. The circuits comprising PFET 301 and NFETS 302-304, PFET 311 and NFETS 312-314, and PFET 321 and NFETS 322-324 operate to delay negative transitions at their outputs (e.g., 220, 308 and 307). If PW 205 signals M1 and M2 are a logic zero, then the positive potential 305 determines the conductivity of the NFETs 302, 312, and 322 and thus how quickly the node capacitance can be discharged to drive the nodes 220, 308 and 307 to a logic zero. In one embodiment, M1 and M2 are binary logic signals and thus provide the possibility of four values of feedback delay through pulse width control 204. It is understood that M1 and M2 may be analog signals and may be used to provide continuous control of the delay through pulse width control 204 between a maximum and a minimum value.

Figure 4:
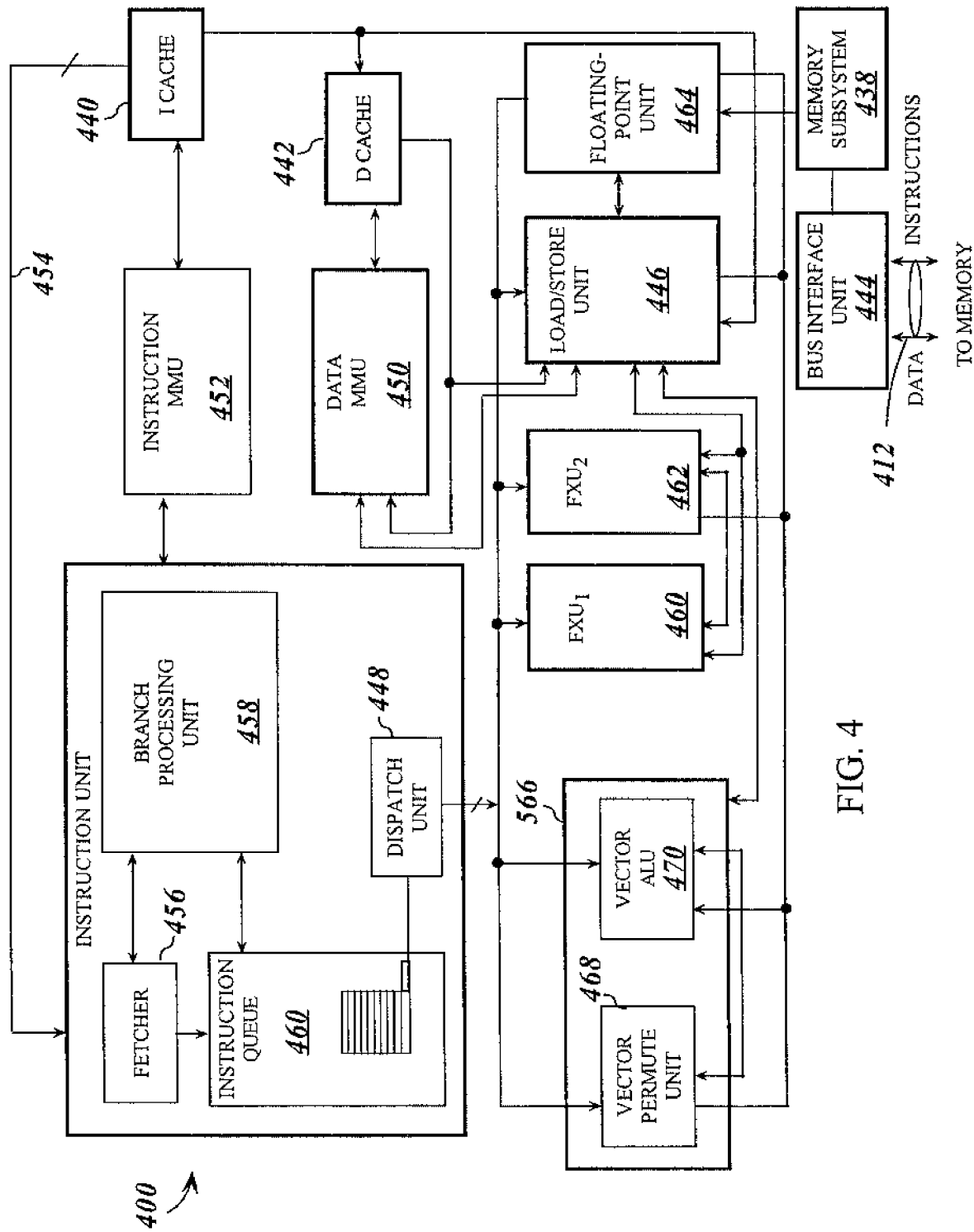
FIG. 4 is a block diagram of a processor suitable for practicing embodiments of the present invention where a global clock is distributed to various logic units on an integrated circuit (IC).

FIG. 4 is a high level functional block diagram of selected operational blocks that may be included in a central processing unit (CPU) 400. In the illustrated embodiment, CPU 400 includes internal instruction cache (I-cache) 440 and data cache (D-cache) 442 which are accessible to memory (not shown in FIG. 4) through bus 412, bus interface unit 444, memory subsystem 438, load/store unit 446 and corresponding memory management units: data MMU 450 and instruction MMU 452. In the depicted architecture, CPU 400 operates on data in response to instructions retrieved from I-cache 440 through instruction dispatch unit 448. Dispatch unit 448 may be included in instruction unit 454 which may also incorporate fetch unit 456 and branch processing unit 458 which controls instruction branching. An instruction queue 460 may interface fetch unit 456 and dispatch unit 448. In response to dispatched instructions, data retrieved from D-cache 442 by load/store unit 446 can be operated upon by one of fixed point unit (FXU) 460, FXU 462 or floating point execution unit (FPU) 464. Additionally, CPU 400 provides for parallel processing of multiple data items via vector execution unit (VXU) 466. VXU 466 includes vector permute unit 468 which performs permutation operations on vector operands, and vector arithmetic logic unit (VALU) 470 which performs vector arithmetic operations, which may include both fixed-point and floating-point operations on vector operands. CPU 400 may have a global clock distributed to various logic units employing local clock generation according to embodiments of the present invention.

Figure 5:
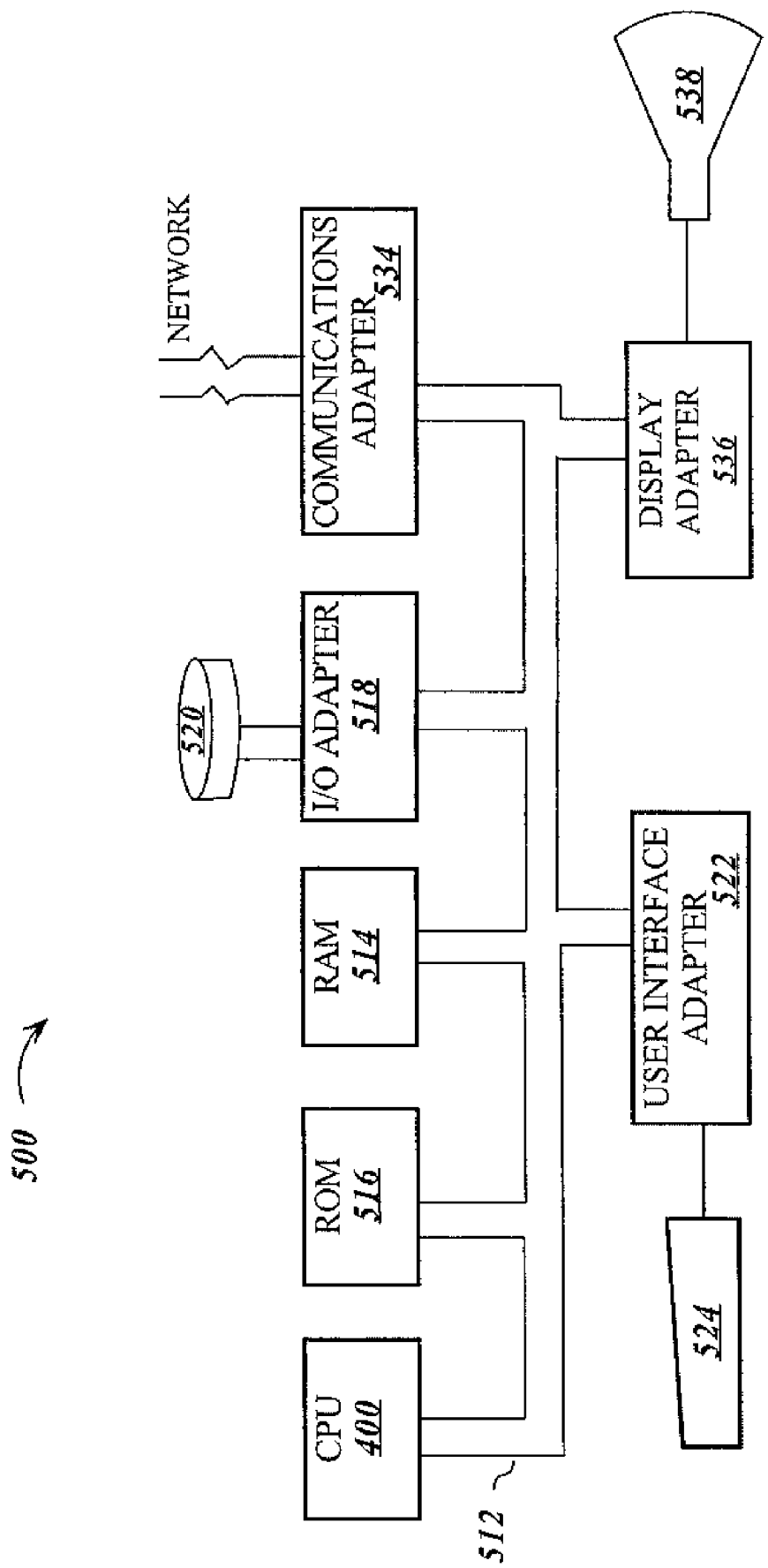
FIG. 5 is a block diagram of a data processing system suitable for practicing embodiments of the present invention using the processor of FIG. 4.

A representative hardware environment 500 for practicing the present invention is depicted in FIG. 5, which illustrates a typical hardware configuration of a data processing system in accordance with the subject invention having CPU 400, incorporating a global clock distributed to various logic units employing local clock generation according to the present inventive principles, and a number of other units interconnected via system bus 512. The data processing system shown in FIG. 5 includes random access memory (RAM) 514, read only memory (ROM) 516, and input/output (I/O) adapter 518 for connecting peripheral devices such as disk units 520 to bus 512, user interface adapter 522 for connecting keyboard 524, mouse 526, and/or other user interface devices such as a touch screen device (not shown) to bus 512, communication adapter 534 for connecting the system to a data processing network, and display adapter 536 for connecting bus 512 to display device 538. Note that CPU 400 may reside on a single integrated circuit.

Figure 6:
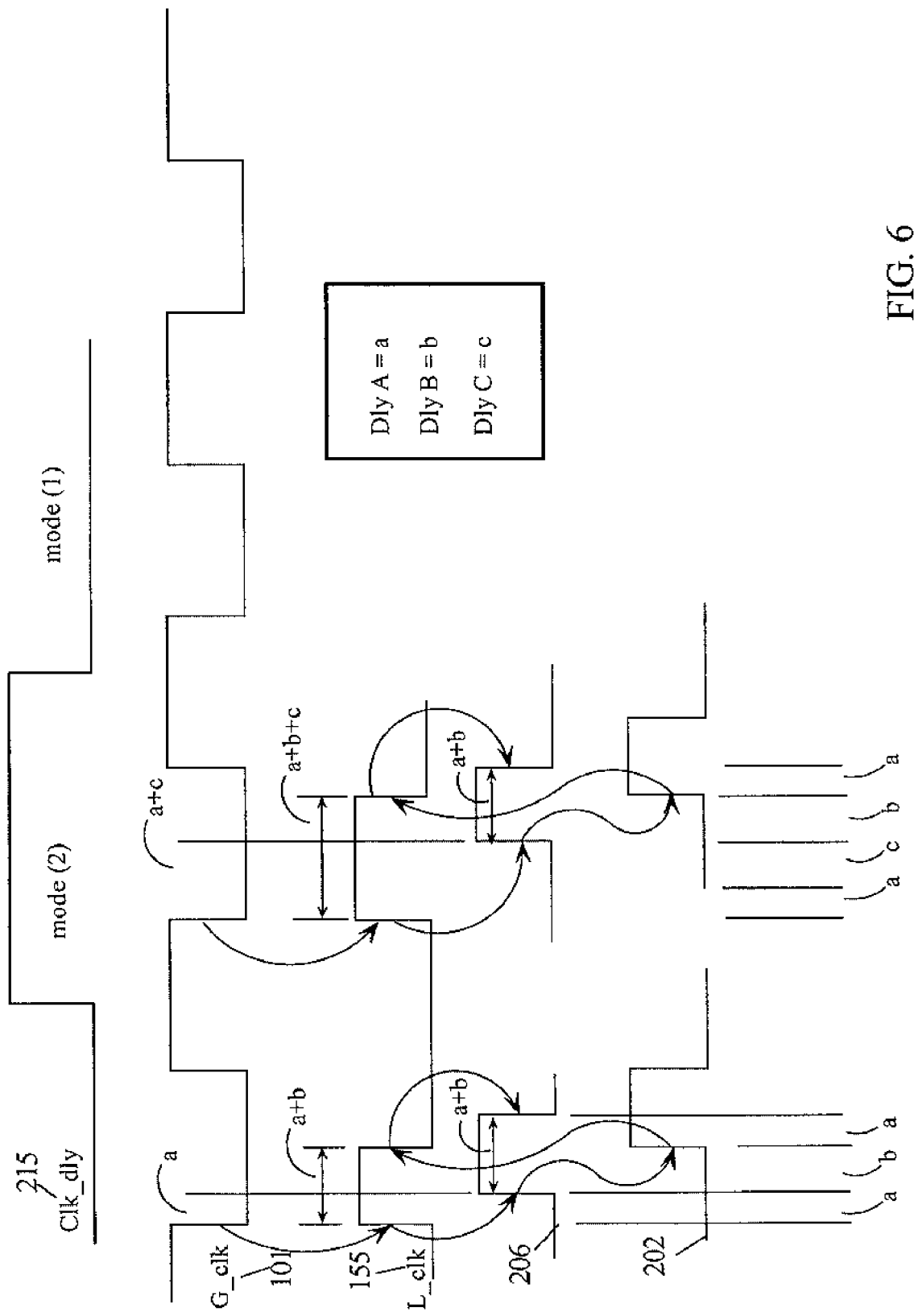
FIG. 6 is a timing diagram of signals at nodes of the circuitry shown in FIG. 3.

FIG. 6 is a timing diagram of various signals from FIG. 2 during mode (1) and mode (2). Mode (1) is defined as the time when Clk_dly 215 is a logic zero and mode (2) is defined as the time when Clk_dly 215 is a logic one. A negative transition of G_clk 101 causes L_clk 155 to transition to a logic one through NOR 158. The delay time Dly A later, Clk 206 transitions to a logic one. After the delay time Dly B node 222 transitions to a logic one forcing L_clk 155 back to a logic zero setting its pulse width. The pulse width of Clk 206 is determined by the time Dly A plus Dly B.

Mode (2) is defined as the time when Clk_dly 215 is a logic one. A negative transition of G_clk 101 causes L_clk 155 to transition to a logic one through NOR 158. After a delay time, Dly A plus Dly C, Clk 206 transitions to a logic one. Then, after the delay time Dly B, node 222 transitions to a logic one forcing L_clk 155 back to a logic zero setting its pulse width. Only the positive edge of the pulse at L_clk 155 undergoes the time delay Dly C in the forward path, therefore the pulse width of Clk 206 remains as the time Dly A plus Dly B in mode (2) even though the pulse width at L_clk 155 is the sum of Dly A, Dly B and Dly C.

Although the present invention and its advantages have been described in detail, it should be understood that various changes, substitutions and alterations can be made herein without departing from the spirit and scope of the invention as defined by the appended claims.

What is claimed is:

1. A programmable clock generator comprising:
   an input logic circuit receiving a global clock signal and generating a local clock signal in response to a feedback clock signal from a feedback path and a feedback gate signal, wherein the input logic circuit forms a first part of the feedback path and a pulse width of the local clock signal is determined by a first delay of a feed-forward path and a second delay of the feedback path;
   a feed-forward circuit receiving the local clock signal and generating a data clock in response to a clock delay signal, wherein the feed-forward circuit forms the feed-forward path and delays transitions of the local clock signal the first delay time when the clock delay signal is a first logic state and delays a positive transition of the local clock signal an additional third delay time when the clock delay signal is a second logic state; and
   a feedback circuit forming a second part of the feedback path and receiving the data clock signal and the local clock signal and generating the feedback clock signal in response to a feedback delay control signal,
   wherein the data clock signal is a pulse signal with a pulse width equal to the first delay plus the second delay, independent of the clock delay signal, and delayed the first delay time relative to the local clock signal when the clock delay signal has the first logic state and further, the data clock signal is delayed relative to the local clock signal the sum of the first and third delay times when the clock delay signal has the second logic state.

2. The programmable clock generator of claim 1 further comprising a clock control circuit receiving a scan control signal, a clock gate signal and the global clock signal and generating the feedback gate signal.

3. The programmable clock generator of claim 1, further comprising a scan clock circuit receiving a scan gate signal, the local clock signal and generating a scan clock signal, wherein the scan clock signal is gated to the second logic state when the scan gate signal has the first logic state.

4. The programmable clock generator of claim 1, wherein the feed-forward circuit further receives the scan gate signal and the data clock is gated to a static logic state when the scan gate signal has the second logic state.

5. The programmable clock generator of claim 3, wherein the feedback circuit receives the scan clock signal and generates the local clock signal as a pulse signal whose pulse width is determined by the delay of the feedback path and a delay through the scan clock circuit.

6. The programmable clock generator of claim 3, wherein the scan gate signal is generated by latching a state of the scan control signal in response to the global clock signal.

7. The programmable clock generator of claim 1, wherein the second delay of the feedback circuit is determined by a logic state of the feedback delay control signal.

8. The programmable clock generator of claim 1, wherein the feedback control signals are analog signals and second delay of the feedback circuit is determined by a voltage potential of the feedback delay control signal.

9. The programmable clock generator of claim 1, wherein the feed-forward circuit comprises:
   a first inverter having an input coupled to the local clock signal and output generating a complement of the local clock signal delayed a gate delay;

a first NAND logic gate having a first input coupled to the output of the first inverter, a second input coupled to the clock delay signal, and an output generating a delayed local clock signal delayed by two gate delays;

a second NAND logic gate having a first input coupled to the output of the first NAND logic gate, a second input coupled to the local clock signal, and an output; and a second inverter having an input coupled to the output of the second NAND gate and an output generating the data clock signal.

10. The programmable clock generator of claim 1, wherein the feedback circuit comprises:

a first delay circuit having a first input coupled to the data clock signal, a second input coupled to the feedback control signal and an output generating a complement of the data clock signal wherein only one transition of the data clock signal is delayed in response to the feedback control signal;

a first inverting logic gate having an input coupled to the complement of the data clock signal and a output generating a delayed data clock signal;

a second delay circuit a first input coupled to the output of the inverting logic gate, a second input coupled to the feedback control signal and an output generating a complement of the delayed data clock signal, wherein only one transition of the delayed data clock signal is delayed in response to the feedback control signal; and a second inverting logic gate having a first input coupled to the local clock signal, a second input coupled to the output of the second delay circuit and an output generating the feedback clock signal.

11. The programmable clock generator of claim 10, further comprising a third delay circuit having a first input coupled to the scan clock signal, a second input coupled to the feedback control signal and an output coupled to a second input of the first inverting logic circuit and generating a complement of the scan clock signal wherein only one transition of the scan clock signal is delayed in response to the feedback control signal.

12. The programmable clock generator of claim 10, wherein the first delay circuit comprises:

a PFET having a source terminal coupled to a first voltage potential, a gate terminal coupled to the data clock signal, and a drain terminal;

a first NFET having a drain terminal coupled to the drain terminal of the PFET, a gate terminal coupled to the first voltage potential, and a source terminal coupled to the input of the inverting logic gate;

a second NFET having a drain terminal coupled to the drain terminal of the PFET, a gate terminal coupled to the feedback control signal, and a source terminal coupled to the source terminal of the first NFET; and a third NFET having a drain terminal coupled to the source terminal of the NFET, a gate terminal coupled to the data clock signal, and a source terminal coupled to a second voltage potential.

13. The programmable clock generator of claim 11, wherein the second delay circuit comprises:

a PFET having a source terminal coupled to a first voltage potential, a gate terminal coupled to the output of the inverting logic gate, and a drain terminal coupled to the second input of the second inverting logic gate;

a first NFET having a drain terminal coupled to the drain terminal of the PFET, a gate terminal coupled to the first voltage potential, and a source terminal;

a second NFET having a drain terminal coupled to the drain terminal of the PFET, a gate terminal coupled to the feedback control signal, and a source terminal coupled to the source terminal of the first NFET; and a third NFET having a drain terminal coupled to the source terminal of the first NFET, a gate terminal coupled to output of the first inverting logic gate, and a source terminal coupled to the second voltage potential.

14. A central processing unit (CPU) comprising:

digital processing circuitry for processing digital data; and a memory for storing data and program instructions, wherein the digital processing circuitry has at least one programmable clock generator with an input logic circuit receiving a global clock signal and generating a local clock signal in response to a feedback clock signal from a feedback path and a feedback gate signal, wherein the input logic circuit forms a first part of the feedback path and a pulse width of the local clock signal is determined by a first delay of a feed-forward path and a second delay of the feedback path, a feed-forward circuit receiving the local clock signal and generating a data clock in response to a clock delay signal, wherein the feed-forward circuit forms the feed-forward path and delays transitions of the local clock signal the first delay time when the clock delay signal is a first logic state and delays a positive transition of the local clock signal an additional third delay time when the clock delay signal is a second logic state, and a feedback circuit forming a second part of the feedback path and receiving the data clock signal and the local clock signal and generating the feedback clock signal in response to a feedback delay control signal, wherein the data clock signal is a pulse signal with a pulse width equal to the first delay plus the second delay independent of the clock delay signal and delayed the first delay time relative to the local clock signal when the clock delay signal has the first logic state and the data clock signal is delayed relative to the local clock signal the sum of the first and third delay times when the clock delay signal has the second logic state.

15. The CPU of claim 14 further comprising a clock control circuit receiving a scan control signal, a clock gate signal and the global clock signal and generating the feedback gate signal.

16. The CPU of claim 14, further comprising a scan clock circuit receiving a scan gate signal, the local clock signal and generating a scan clock signal, wherein the scan clock signal is gated to the second logic state when the scan gate signal has the first logic state.

17. The CPU of claim 14, wherein the feed-forward circuit further receives the scan gate signal and the data clock is gated to a static logic state when the scan gate signal has the second logic state.

18. The CPU of claim 16, wherein the feedback circuit receives the scan clock signal and generates the local clock signal as a pulse signal whose pulse width is determined by the delay of the feedback path and a delay through the scan clock circuit.

19. The CPU of claim 16, wherein the scan gate signal is generated by latching a state of the scan control signal in response to the global clock signal.

20. The CPU of claim 14, wherein the second delay of the feedback circuit is determined by a logic state of the feedback delay control signal.

21. The CPU of claim 14, wherein the feedback control signals are analog signals and second delay of the feedback circuit is determined by a voltage potential of the feedback delay control signal.

* * * * *